(12) United States Patent
Fontaine et al.

(10) Patent No.: US 8,211,554 B2
(45) Date of Patent: Jul. 3, 2012

(54) WORKPIECE WITH HARD COATING (75) Inventors: Frédéric Fontaine, Truebbach (CH); Markus Lechthaler, Feldkirch (AU); Wolfgang Kalss, Feldkirch (AU)

(73) Assignee: Oerlikon Trading AG, Truebbach, Truebbach (CH)

( * ) Notice: Subject to any disclaimer, the term of this patent is extended or adjusted under 35 U.S.C. 154(b) by 1160 days.

(21) Appl. No.: 11/858,362

(22) Filed: Sep. 20, 2007

(65) Prior Publication Data

US 2010/0263503 A1 Oct. 21, 2010

Related U.S. Application Data

(60) Provisional application No. 60/826,943, filed on Sep. 26, 2006, provisional application No. 60/909,559, filed on Apr. 2, 2007.

(30) Foreign Application Priority Data

Aug. 30, 2007 (EP) .................. PCT/EP2007/059070

(51) Int. Cl.
*B32B 9/00* (2006.01)
(52) U.S. Cl. .................. 428/697; 428/698; 428/699
(58) Field of Classification Search .................. 428/697, 428/698, 699
See application file for complete search history.

(56) References Cited

U.S. PATENT DOCUMENTS

| 6,824,601 | B2* | 11/2004 | Yamamoto et al. | 428/698 |
|---|---|---|---|---|
| 7,226,670 | B2* | 6/2007 | Derflinger et al. | 428/698 |
| 7,348,074 | B2* | 3/2008 | Derflinger | 428/699 |
| 7,498,089 | B2* | 3/2009 | Omori et al. | 428/697 |
| 7,504,149 | B2* | 3/2009 | Toihara et al. | 428/699 |
| 7,510,761 | B2* | 3/2009 | Kondo et al. | 428/697 |
| 7,521,131 | B2* | 4/2009 | Yamamoto | 428/698 |
| 2005/0003239 | A1 | 1/2005 | Derflinger | |
| 2006/0222893 | A1 | 10/2006 | Derflinger | |
| 2006/0269789 | A1 | 11/2006 | Toihara | |

FOREIGN PATENT DOCUMENTS

| EP | 1219723 A2 | 7/2002 |
|---|---|---|
| EP | 1690959 A2 | 8/2006 |
| WO | 2004059030 A2 | 7/2004 |
| WO | 2006/005217 A2 | 1/2006 |
| WO | 2006/084404 A1 | 8/2006 |

OTHER PUBLICATIONS

International Search Report dated Sep. 19, 2008.
Written Opinion dated Oct. 10, 2008.

* cited by examiner

*Primary Examiner* — Archene Turner
(74) *Attorney, Agent, or Firm* — Pearne & Gordon LLP

(57) ABSTRACT

A workpiece has a body (3) and a wear-resistant hard coating system ($HL_o$), which system comprises a layer of the following composition:

$(Al_{1-a-b-c}Cr_aB_bZ_c)X$ where

X is at least one of: N, C, CN, NO, CO, CNO;
Z is at least one of: W, Mo, Ta, Cb (Nb).
For a, b and c specific ranges of values are valid.

18 Claims, 6 Drawing Sheets

WORKPIECE WITH HARD COATING

The present invention is directed to a workpiece having a body and a wear-resistant hard coating system on at least a part of its surface, further to a process for manufacturing such workpiece and to a method of manufacturing a device.

DISCUSSION OF RELATED ART

TiAlN is a coating which is widely used to machine hardened steel and is customarily applied by a PVD process.

DEFINITION

We understand under a physical vapour deposition process (PVD) a vacuum deposition process, wherein a plasma is used and material is filled into the processing atmosphere from solid. Thereby, under this term of PVD e.g. cathodic arc evaporation, ion plating, sputtering, thereby magnetron sputtering, all the addressed processings reactive or non-reactive are members of the PVD processing category.

In opposition thereto CVD coating processes, chemical vapour deposition, and PECVD, plasma enhanced chemical vapour deposition provide coating out of gaseous phase.

TiAlN layers used as a single layer- or in multilayer-systems with sublayers of different Ti/Al/N stochiometries, can be used up to working temperatures of 900° C. at most for tooling application due to the incipient degradation of hardness at temperatures higher than 800 to 850° C. depending on the Aluminum/Titanium ratio.

Therefore, the US 2005-0003239 proposes to apply AlCrN coatings to workpieces so as to increase their oxidation resistance. This coating is known to have a good oxidation resistance and a hot hardness up to 1100° C. depending on the Aluminum/Chromium ratio. It is further referred to similar proposals in the WO 2006/005217, the WO 2006/084404 and the US 2006-0222893 trying to further improve oxidation resistance and/or hot hardness of the coatings by using different multilayers and/or by introducing other elements into the AlCrN matrix.

The US 2006-0269789 discloses a hard multilayer to cut high hardness material at a high speed. The hard multilayer comprises a first TiAlCrNX-based layer, wherein X stands for C or O. A second layer consists of a mixture of TiAlCrNX and of TiAl(SiC)NX or is a multilayer of layers of these alternative materials. A third outermost layer essentially consists of TiAl(SiC)NX.

Another coating to improve cutting of hardened steels is disclosed in the EP 1 690 959. There the coating comprises a two-layer system based on (TiAlSi)N of different Al and Si stochiometries.

In spite of the approaches as outlined above there is still a need to further improve hard coating systems on workpiece bodies with respect to wear and oxidation resistance, thereby further improving performance of such workpieces, especially used as cutting tools in machining of hard material, thereby especially of hardened steels.

It is thus an object of the present invention to further improve hard coatings with respect to wear resistance and oxidation resistance. To resolve such object there is proposed a workpiece having a body and a wear resistant hard coating system on at least a part of the surface of the body, wherein the system comprises at least one layer of the following composition:

$(Al_{1-a-b-c}Cr_aB_bZ_c)X$, where

X is at least one of N, C, CN, NO, CO, CNO and
Z is at least one of W, Mo, Ta, Cb (also referred to as Nb) and wherein there is valid $0.2 \leq a \leq 0.5$ $0.01 \leq b \leq 0.2$ $0.001 \leq c \leq 0.04$.

Astonishingly, the addressed object is achieved by generically adding boron (B) and at least one of the addressed Z elements to a matrix of AlCrX type by fulfilling the addressed conditions with respect to stochiometry. We address this layer as $HL_0$.

In a preferred embodiment of the workpiece according to the invention the element Z is selected to be tungsten W and there is established $0.01 \leq b \leq 0.1$ and $0.001 \leq c \leq 0.01$ We address this layer as $HL_1$.

We understand throughout the present description and claims under the term "coating system" or "coating subsystem" a system which consists of one single layer or of multiple, i.e. more than one layers.

The addressed at least one layers $HL_0$ possibly $HL_1$ may thereby be applied directly on the surface of the workpiece body. They further may be applied to form the outermost layer of the coating system. Clearly, if such coating system consists of one layer, then the addressed layer of HL-type resides directly on the surface of the body and is the outermost layer. The layer of $HL_0$-type may further be the outermost layer of a multilayer system. It further may be embedded within a multilayer system between a first layer subsystem towards the surface of the workpiece body and a second layer subsystem towards the surface of the coated body. Still further, in a multilayer system more than one of the addressed $HL_o$-type layers of equal or of varying stochiometry and/or material composition may be provided. Thereby, such layers of $HL_o$-type may reside directly one upon the other with different stochiometry and/or material composition or may be separated by respective coating layer subsystems.

In one embodiment of the workpiece according to the present invention the at least one layer $HL_0$ or $HL_1$ resides outermost of the hard coating system.

In one embodiment of the workpiece according to the present invention the at least one layer of $HL_0$-type resides directly on the surface of the body of said workpiece.

Still in a further embodiment the system comprises at least one interlayer of $(Ti_dAl_e)N$. Thereby, in a further embodiment at least one of the addressed interlayers is interposed between the surface of the body and the addressed at least one $HL_0$-type layer. We address this interlayer as $IL_1$.

In a further embodiment of the workpiece the addressed interlayer resides directly on at least one of the surface of the workpiece and of the at least one layer of $HL_o$-type.

Thus, in the embodiment wherein the interlayer is interposed between the surface of the body and the at least one $HL_0$ or $HL_1$, further interlayers of the addressed type may additionally be provided between the $HL_0$ or $HL_1$ and the surface of the system. Further, the addressed intermediate layer must not necessarily reside as the only layer between the surface of the body and the surface of the $HL_1$ or $HL_0$, additional layers may be provided therebetween, so that the interlayer is one layer of a multilayer subsystem between the surface of the body and $HL_0$ or $HL_1$. Nevertheless, in one embodiment the addressed intermediate coating directly resides upon at least one of the surface of the body and the $HL_0$ or $HL_1$. When applying the at least one interlayer of $(Ti_dAl_e)N$ in a further embodiment there is applied:

$$0.4 \leq d \leq 0.6 \text{ and}$$

$$0.4 \leq e \leq 0.6.$$

In a further embodiment of the workpiece according to the present invention the hard coating system comprises at least one interlayer of $(Al_fCr_g)N$. We address this interlayer as $IL_2$.

With respect to where such at least one interlayer may be provided the same prevails as was addressed above with respect to the $(Ti_dAl_e)N$ layer -$IL_1$-, with the exception that for the $(Al_fCr_g)N$ interlayer, in a further embodiment there is selected $$0.4 \leq f \leq 0.7 \text{ and}$$

$$0.3 \leq g \leq 0.6.$$

Further, both the addressed interlayers $IL_1$ and $IL_2$ may be provided in combination within the hard coating system.

Still in a further embodiment of the workpiece according to the present invention, the at least one layer, $HL_0$ or $HL_1$, exhibits a nanocrystalline glassy-like growth structure in the SEM cross-section and/or, as in a further embodiment, a relatively small fraction of AlN characterized by a crystal structure of the hexagonal type. Such hexagonal AlN phase in this embodiment resides with a percentage of Al of at least 70% within the metallic fraction of the $HL_0$ or $HL_1$ material, which fraction comprises all the elements but X of AlCrBZX or AlCrBWX.

Such hexagonal structure may be recognized by XRD analysis.

In a further embodiment of the workpiece according to the present invention the at least one $HL_0$ or $HL_1$ has a texture coefficient $Q=I(200)/I(111)$ in the range of $0.1 \leq Q \leq 1$. Such texture coefficient Q may be measured by X-ray diffraction analysis. As addressed, the term Q is defined as the ratio of the diffraction intensities I(200) to I(111) assigned respectively to the (200) and (111) planes in the X-ray diffraction of a material using a measuring setup as e.g. described in context with FIG. 4 of the present description. Thereby, in a further embodiment the addressed range of Q is even restricted to $0.1 \leq Q \leq 0.4$.

Looking back to the addressed interlayers $IL_1$, $IL_2$ it should be mentioned that in respective embodiments these interlayers may exhibit a columnar growth structure, thereby giving to the overall coating system an excellent performance, especially if used on a cutting tool.

In a further embodiment of the workpiece according to the present invention the hard coating system comprises a multilayer of alternating layers of at least one of the addressed interlayers $IL_1$, $IL_2$ and of at least one of $HL_0$ and $HL_1$, thereby preferably of (AlCrBW)X, i.e. $HL_1$.

Such a multilayer may e.g. comprise, departing from the surface of the body, a first of the addressed interlayers $IL_1$, then possibly a second of the addressed interlayers $IL_2$ of different type, then a first HL, i.e. $HL_0$ or $HL_1$, then again one or more than one of said interlayers $IL_1$, $IL_2$, a second $HL_0$ or $HL_1$ of same or of different material, a third $HL_0$ or $HL_1$ directly upon the former one, etc. etc. Thus, depending on the specific application there is a large variety of tailoring such multilayer hard coating system making use of the $HL_0$ or $HL_1$ and of the addressed intermediate layers $IL_1$, $IL_2$ in different combinations.

In a further embodiment of the workpiece according to the invention the body is of high speed steel, hardened steel, cemented carbide or of cubic boron nitride or in a further embodiment of a cermet or of ceramic material.

Still in a further embodiment the addressed workpiece according to the present invention is a cutting tool, thereby in a further embodiment an end mill, a drill, a cutting insert or a gear cutting tool.

A process according to the present invention for manufacturing a workpiece as was addressed, i.e. according to the present invention comprises providing such workpiece body in a plasma coating vacuum chamber, applying the hard coating system to the body by a physical vapour deposition process (PVD) during a processing time and thereby establishing a temperature of at least 550° C. to the surface of the coated body during at least a predominant part of processing time.

In one embodiment of such process the addressed temperature is selected to be at least 600° C.

Still under a further aspect the present invention is directed on a method of manufacturing a device which has at least a part of a hard material. Such method comprises a cutting process of the hard material of the device using a cutting tool according to the present invention. Thereby, still in a further embodiment of the addressed device manufacturing method, the hard material has a Rockwell hardness of at least 52 HRC, thereby even of at least 55 HRC. Still in a further embodiment of the just addressed manufacturing method the hard material is hardened steel.

Cutting processes have been performed with cutting tools according to the present invention which showed on hard material results at least as good or even better than comparative examples performed with state of the art tools.

However, cutting operation on hardened steel or other high hardness materials having a Rockwell hardness of HRC 50, especially of HRC 52 or higher, even of HRC higher than 55, the tools according to the present invention revealed a performance which was outstandingly good as will be shown below.

The present invention shall now be further described by means of examples and with the help of figures. The figures show.

Figure 1:
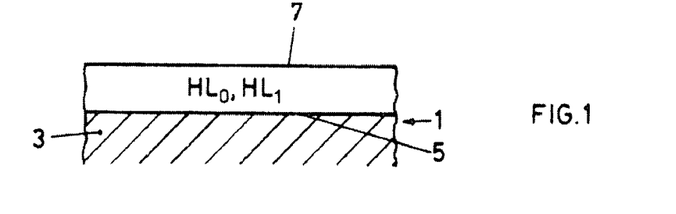
FIG. 1 schematically a part of a first embodiment of a workpiece according to the present invention.

In FIG. 1 there is schematically shown a first embodiment of a workpiece 1 according to the present invention. The workpiece 1 has a body 3 with a surface 5. The body is of one of the materials high speed steel, hardened steel, cemented carbide, cubic boron nitride, cermet or of a ceramic material.

According to the embodiment of FIG. 1 one of the layers $HL_o$ which may be $HL_1$ directly resides on the surface 5 of the body 3.

Thereby, the surface 7 of the resulting workpiece is formed by one surface of the addressed layer $HL_o$ which thus, as a good embodiment, forms the outermost surface of the workpiece.

Figure 2:
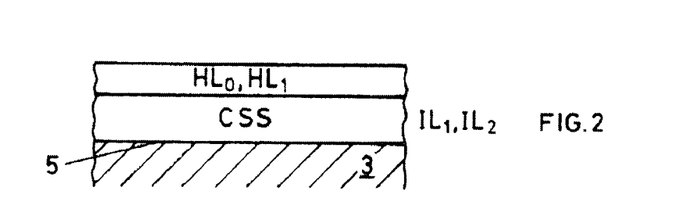
FIG. 2 in a representation analogous to that of FIG. 1, a second embodiment of a workpiece according to the invention.

In the embodiment of FIG. 2 which is shown in a representation which is analogous to that of FIG. 1 there is provided a coating subsystem CSS between the addressed layer $HL_o$ which may be $HL_1$ and surface 5 of the body 3. Such coating subsystem CSS may thereby according to the definition of coating subsystems as made above comprise one or more than one layers.

As may be seen in the definition of the layers $HL_o$ and also $HL_1X$, and in the case of $HL_o$ also Z may consist of different elements. According to the embodiment of FIG. 3 the outermost layer of the hard coating system is formed by $HL_o$ in a first material composition, denoted by $HL_{o1}$ or by the layer $HL_1$, in one specific material composition, denoted by $HL_{11}$. Propagating towards the substrate 3 there is provided a second layer $HL_0$ in a different material composition denoted by $HL_{02}$ or respectively by $HL_1$ in a different material composition, denoted by $HL_{12}$.

Figure 3:
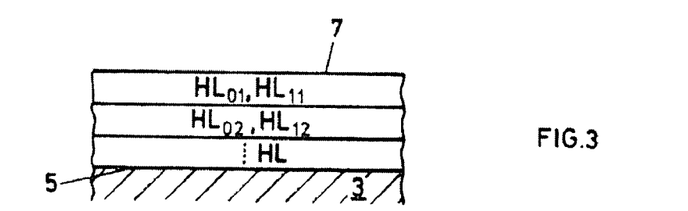
FIG. 3 in a representation analogous to those of FIGS. 1 and 2 a further embodiment of a workpiece according to the invention.

There may or may not follow further layers of the $HL_0$ type and/or of the $HL_1$ type up to surface 5 of the body 3.

Figure 4:
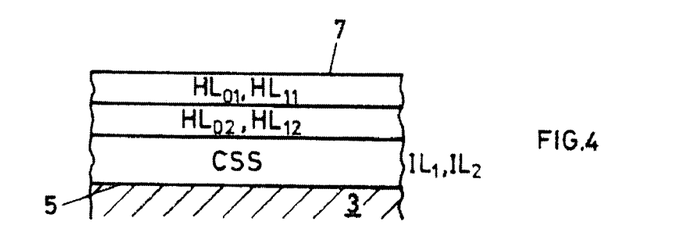
FIG. 4 in a representation analogous to those of FIGS. 1 to 3 a further embodiment of a workpiece according to the invention.

Whereas at the embodiment of FIG. 3 the coating system consists of $HL_{0x}$ layers, at least a part thereof possibly $HL_{1x}$ layers, in the embodiment according to FIG. 4 there is the hard coating system comprises a coating subsystem CSS. Such coating subsystem may or may not comprise further of the $HL_o$-type layers, but does additionally comprise at least one layer which is not of the addressed $HL_o$-type.

In all the embodiments of FIGS. 1 to 4 the outermost layer with the surface 7 is formed by a layer of the addressed $HL_o$-type. This is a good approach to form the addressed outermost surface of the workpiece.

Nevertheless and e.g. with an eye on FIG. 4 for some appliances it might be advisable to provide (not shown) a further coating subsystem on top of the outermost $HL_o$-type layer so that the outermost surface 7 is formed by such outermost subsystem.

Figure 5:
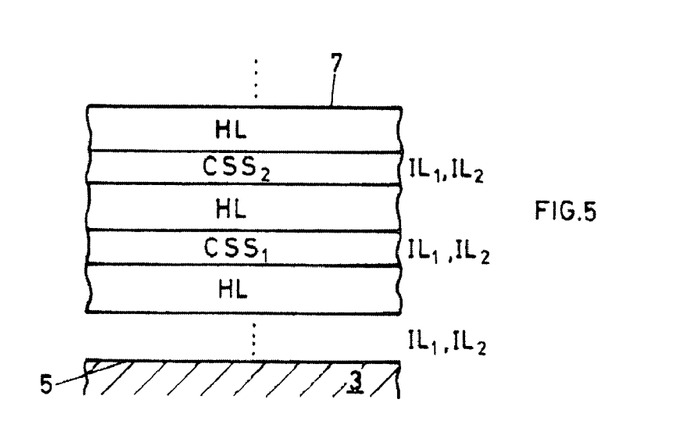
FIG. 5 in a representation analogous to those of FIGS. 1 to 4 a still further embodiment of a workpiece according to the invention.

In the embodiment according to FIG. 5 layers of the $HL_o$-type alternate with coating subsystems CSS. Thereby, the alternatingly applied layers of $HL_o$-type may be equal or different with respect to material composition.

The alternating coating subsystems again may consist of one or more than one layers, at least one thereof being not of the $HL_o$-type.

As exemplified by the embodiment according to FIGS. 1 to 5 there exists a large variety to apply $HL_o$ layers to the body 3 of the workpiece, in dependency of the specific needs for such workpiece. Especially if the workpiece is a tool, especially a cutting tool, it is suggested to select as the outermost layer of the coating system a $HL_o$-type layer.

We have addressed in the introductory part of the description a first interlayer of $(Ti_dAl_e)N$ especially with d and e in specific ranges of values as $IL_1$ and have addressed a second type of interlayer of $(Al_fCr_g)N$, with specific ranges for f and g as $IL_2$.

With an eye on the embodiments of FIGS. 1 to 5 each of the addressed coating subsystems CSS may comprise or consist of $IL_1$ or of $IL_2$ or may comprise or consist of a combination of $IL_1$ and $IL_2$, and may comprise additional layers of the $HL_o$-type or of layers different from $HL_o$ type and $IL_1$, $IL_2$.

Again, the skilled artisan recognizes from the addressed embodiments according to the FIGS. 1 to 5 incorporating the interlayers $IL_1$ and/or $IL_2$ a larger variety of combinations selectable dependent on respective needs.

In the following some specific embodiments of the workpiece according to the present invention are exemplified. Cutting performance of workpieces according to the invention conceived as cutting tools were compared with such tools according to the state of the art, thereby equal cutting operations and cutting parameters were applied to the respective tools according to the present invention and to the comparative tools according to the state of the art, for valid comparison purpose.

The hard coating systems applied to the specimens in the following examples were deposited under the following conditions, if not specifically and differently specified, whereby the process for manufacturing the workpieces according to the present invention was applied.

Deposition technology: Cathodic arc evaporation

Total working pressure: 5.5 Pa of $N_2$

Bias voltage of the body to be coated: −85V against ground potential for $HL_0$ type layers and −100V against ground potential for $IL_1$ and $IL_2$ layers Surface temperature of body being coated: 600° C.

Evaporation current: 200 A per evaporation target

The hard coating systems were deposited in a Balzers RCS coating machine in arc evaporation configuration. The cutting tool bodies were mounted on threefold rotating holders during the PVD deposition.

All the hard coating systems deposited on the cutting tool body had a total thickness between 2 and 2.5 µm, measured on the shank of the cutting tool.

EXAMPLE 1

A first series of mono-layered hard coating systems was compared with state of the art monolayer system of TiAlN and AlCrN.

Table 1 displays the hard coating system investigated under this example. To apply each of the addressed monolayer hard coating systems the coating machine was equipped with four identical arc evaporation cathodes, also called targets. The respective compositions of these targets are also listed in table 1. The resulting composition of the coating material was within 10% of the target composition for the main elements Al, Cr, Ti and was within about 20% of the target composition for the element B and W, Mo and Ta.

TABLE 1

| No. | Hard coating | Target composition |
|---|---|---|
| $1_{com.}$ | TiAlN | Ti0.5Al0.5 |
| $2_{com.}$ | TiAlN | Ti0.33Al0.67 |
| $3_{com.}$ | AlCrN | Al0.7Cr0.3 |
| 4 | AlCrBWN | Al0.7Cr0.226B0.067W0.007 |

TABLE 1-continued

| No. | Hard coating | Target composition |
| --- | --- | --- |
| 5 | AlCrBMoN | Al0.7Cr0.21B0.07Mo0.02 |
| 6 | AlCrBTaN | Al0.7Cr0.226B0.067Ta0.007 |

The performance of the hard coating systems was assessed in terms of wear resistance in a metal cutting operation. The amount of wear on the flank face, $v_{bmax}$, was measured as a function of the length of the cut. The cutting test was a milling test under finishing conditions in a hardened cold work tool steel. The cutting conditions were the following:

| | |
| --- | --- |
| Cutting tool: | 2-fluted ball nose end mill, 5 mm ball radius, micro grain carbide grade material |
| Workpiece: | 1.2379 60 HRC |
| Spindle rotation speed: | 7996 rev/min |
| Axial depth of cut: | 0.4 mm |
| Radial depth of cut: | 0.2 mm |
| Feed rate: | 0.1 mm/tooth |
| Cutting speed: | 98 m/min |
| Feed: | 1600 mm/min |
| Coolant: | air |
| Milling direction: | down milling |
| Length of 1 pass: | 43.8 m |
| End of tool life: | $v_{bmax} > 0.15$ mm at the end of a pass |

The results of the cutting test are listed in Table 2.

TABLE 2

| No. | Cutting length (m) | Amount of wear $v_{bmax}$ (mm) |
| --- | --- | --- |
| $1_{com.}$ | 87.6 | 0.25 |
| $2_{com.}$ | 87.6 | 0.17 |
| $3_{com.}$ | 87.6 | 0.2 |
| 4 | 131.4 | 0.25 |
| 5 | 131.4 | 0.33 |
| 6 | 131.4 | 0.41 |

It can be seen that the incorporation of B and W, Mo and Ta in AlCrN results in an improved wear protection compared with the wear protection of AlCrN and TiAlN according to the comparative specimens 1 to 3.

EXAMPLE 2

A series of double-layer hard coating systems was prepared. Table 3 lists the hard coating systems as investigated. The same tool bodies of the material as of Example 1 were coated. Thereby directly upon the surface of the tool body there was applied an interlayer $IL_1$ and directly upon such interlayer a layer of $HL_1$-type. The machine was equipped with two identical targets for the deposition of the interlayer and with four identical targets for the deposition of the outer layer of the $HL_1$-type. The respective target material compositions are also listed in table 3.

TABLE 3

| | Hard coating | | Target composition | |
| --- | --- | --- | --- | --- |
| No. | Inter-layer | Outer layer | Inter-layer | Outer layer |
| $7_{com.}$ | TiAlN | AlCrN | Ti0.5Al0.5 | Al0.7Cr0.3 |
| 8 | TiAlN | AlCrBWN | Ti0.33Al0.67 | Al0.7Cr0.226B0.067W0.007 |
| 9 | TiAlN | AlCrBWN | Ti0.5Al0.5 | Al0.7Cr0.226B0.067W0.007 |

The performance of the tools according to this second series was investigated with the same cutting test as was applied to the example 1 tools. The results are listed in table 4.

Thereby, the interlayer $IL_1$ of specimen No. 9 shows a stochiometry which is well within the range of $$0.4 \leq d \leq 0.6$$

$$0.4 \leq e \leq 0.6$$

of the $(Ti_dAl_e)N$ of the interlayer $IL_1$, whereas the interlayer as applied in example No. 8 is just outside the addressed stochiometry range.

TABLE 4

| No. | Cutting length (m) | Amount of wear $v_{bmax}$ (mm) |
| --- | --- | --- |
| $7_{com.}$ | 87.6 | 0.4 |
| 8 | 267.8 | 0.18 |
| 9 | 438 | 0.15 |

When applying a $IL_1$ interlayer to the inventively provided HL-type layer especially tailored as $HL_1$-type layer with X=N, provision of such interlayer most significantly improves wear resistance and even more if the addressed stochiometry ranges for the aluminum and titanium compounds are fulfilled.

EXAMPLE 3

A further series of workpieces, namely tools with a hard coating system according to the present invention consisting of two layers, was prepared, namely consisting of an interlayer TiAlN, $IL_1$, directly between a tool body as was already used in the examples 1 and 2 and a $HL_1$-type layer with X=N as already provided in specimens 8 and 9 of Table 3. Thereby, the temperature of a surface being coated was varied between 450° C. and 600° C. by varying heating time and/or power.

For the specimens 10, 11 and 12 as follow the same targets for the interlayer as well as for the outermost layer were used as specified for specimen No. 9.

Table 5 shows on one hand the addressed layers of the coating system and on the other hand the deposition temperatures.

TABLE 5

| | Hard coating | | |
| --- | --- | --- | --- |
| No. | Inter-layer | Outer layer | Deposition temperature (° C.) |
| 10 | TiAlN | AlCrBWN | 450 |
| 11 | TiAlN | AlCrBWN | 550 |
| 12 | TiAlN | AlCrBWN | 600 |

The performance of the specimens was investigated with the same cutting conditions as Example 1. The results are listed in the following Table 6.

TABLE 6

| No. | Cutting length (m) | Amount of wear $v_{bmax}$ (mm) |
|---|---|---|
| 10 | 223 | 0.55 |
| 11 | 350.4 | 0.5 |
| 12 | 438 | 0.15 |

The results show on one hand that specimen No. 12 which was coated identically to specimen No. 9 of example 2 exhibits equal wear resistance compared with the addressed specimen 9. Further, specimen 10 reveals that even at lower temperatures of 450° C. the coating system according to the present invention is significantly superior to a comparable two-layer coating system coated at 600° C. as of specimen No. 7.

Further, it is evident from comparing the specimens 10 to 12 that wear resistance significantly increases with increasing deposition temperature and achieves best performance, as of specimen No. 12, at a maximum deposition temperature of 600° C. as investigated or more.

EXAMPLE 4

A fourth series of double-layered hard coating systems with an interlayer $IL_1$ and a $HL_1$-type layer of the specific embodiment with X=N was prepared.

As comparison specimens prior art single layer systems of TiAlN and AlCrN were selected. The following Table 7 lists the respective coating material and the target composition.

TABLE 7

| No. | Hard coating | | Target composition | |
|---|---|---|---|---|
| $13_{com}$ | TiAlN | | Ti0.5Al0.5 | |
| $14_{com}$ | AlCrN | | Al0.7Cr0.3 | |
| | Inter-layer | Outer layer | Inter-layer | Outer layer |
| 15 | TiAlN | AlCrBWN | Ti0.5Al0.5 | Al0.7Cr0.226B0.067W0.007 |

The performance of the resulting tools was assessed in terms of wear resistance in metal cutting application. The amount of wear on the flank face $v_{bmax}$ was measured in function of the length of the cut. The cutting tests were performed under the conditions of semi-finishing milling operation in a heat treated tool steel. The cutting conditions were the following:

| | |
|---|---|
| Cutting tool: | 3-fluted end mill, 8 mm diameter, micro grain carbide grade |
| Workpiece: | 1.2344 36 HRC |
| Spindle rotation speed: | 4775 rev/min |
| Axial depth of cut: | 10 mm |
| Radial depth of cut: | 0.5 mm |
| Feed rate: | 0.05 mm/tooth |
| Cutting speed: | 120 m/min |
| Feed: | 716 mm/min |
| Coolant: | 6% mineral oil based emulsion, external cooling |
| Milling direction: | down milling |
| Length of 1 pass: | 10 m |
| End of tool life: | $v_{bmax} > 0.15$ mm at the end of a pass |

Table 8 reveals the cutting test results.

TABLE 8

| No. | Cutting length (m) | Amount of wear $v_{bmax}$ (mm) |
|---|---|---|
| $13_{com.}$ | 30 | 0.17 |
| $14_{com.}$ | 80 | 0.17 |
| 15 | 100 | 0.18 |

EXAMPLE 5

A series of tools with double-layer coating systems, namely consisting of an $IL_1$ interlayer and a $HL_1$-type layer with X=N was prepared. They were compared with respective tools coated with state of the art double-layer coating systems, namely of TiN as interlayer and TiAlN as outermost layer or coated with AlCrN as interlayer and a TiSiN as outermost layer.

Table 9 shows the respective layer material and target material compositions.

TABLE 9

| No. | Hard coating | | Target composition | |
|---|---|---|---|---|
| | Multilayer | | | |
| $16_{com}$ | TiN—TiAlN | | Ti—Ti0.5Al0.5 | |
| $17_{com.}$ | AlCrN—TiSiN | | Al0.7Cr0.3—Ti0.85Si015 | |
| | Double layer | | | |
| | Inter-layer | Outer layer | Inter-layer | Outer layer |
| 18 | TiAlN | AlCrBWN | Ti0.5Al0.5 | Al0.7Cr0.226B0.067W0.007 |

The performance of the respectively coated tools was assessed in drilling operation on heat treated steel. The amount of wear on the flank face of the main cutting edge $v_{bmax}$ was used to assess the wear protection quality. The test conditions were the following:

| | |
|---|---|
| Cutting tool: | 2-flute drill, 6.8 mm diameter, fine grain carbide grade |
| Workplace: | 1.7225, $R_m = 1000$ N/mm², annealed to a Brinell hardness of 240 HB |
| Spindle rotation speed: | 4684 rev/min |
| Max. cutting speed: | 100 m/min |
| Feed rate: | 0.18 mm/rev |
| Feed: | 843 mm/min |
| Hole depth: | 34 mm |
| Coolant: | 6% mineral oil based emulsion, external cooling |
| End of tool life: | $v_{bmax} > 0.2$ mm |

The following table 10 displays the drilling results.

TABLE 10

| No. | Number of holes | Amount of wear $v_{bmax}$ (mm) |
|---|---|---|
| $16_{com.}$ | 2128 | 0.2 |
| $17_{com.}$ | 2432 | 0.18 |
| 18 | 912 | 0.25 |

This example makes clear that the tools according to the present invention may not be the best choice for use in highly annealed steels and soft materials.

In the following examples No. 6 to 8 the hard coating systems were deposited again as was already addressed for the previous examples, but the total working pressure $N_2$ was reduced from 5.5 Pa to 3.5 Pa and the substrate bias voltage against ground was increased from −85 V to −100 V for the deposition of the AlCrBWN outermost layer according to $HL_1$ with X=N.

EXAMPLE 6

A sixth series of tools was prepared to establish the effect of an AlCrN interlayer $IL_2$ instead of a TiAlN— interlayer $IL_1$.

The Table 11 shows the respective layer materials and the target compositions.

TABLE 11

| | Hard coating | | Target composition | |
| | | | Double layer | |
| No. | Inter-layer | Outer layer | Inter-layer | Outer layer |
| --- | --- | --- | --- | --- |
| 19 | TiAlN | AlCrBWN | Ti0.5Al0.5 | Al0.7Cr0.226B0.067W0.007 |
| 20 | AlCrN | AlCrBWN | Ti0.5Al0.5 | Al0.7Cr0.226B0.067W0.007 |

Using tools coated as addressed, a cutting test with the following parameters was applied

| | |
| --- | --- |
| Cutting tool: | 2-fluted ball nose end mill, 5 mm ball radius, micro grain carbide grade material |
| Workpiece: | 1.2379 60 HRC |
| Spindle rotation speed: | 6370 rev/min |
| Axial depth of cut: | 0.3 mm |
| Radial depth of cut: | 0.5 mm |
| Feed rate: | 0.15 mm/tooth |
| Cutting speed: | 200 m/min |
| Feed: | 1911 mm/min |
| Coolant: | air |
| Milling direction: | down milling |
| Length of 1 pass: | 30 m |
| End of tool life: | $v_{bmax}$ > 0.10 mm at the end of a pass |

The results are shown in Table 12.

TABLE 12

| No. | Cutting length (m) | Amount of wear $v_{bmax}$ (mm) |
| --- | --- | --- |
| 19 | 270 | 0.11 |
| 20 | 240 | 0.12 |

From these results it may be seen that providing a $IL_1$ or a $IL_2$ interlayer leads substantially to the same good results.

EXAMPLE 7

By the seventh series of specimens it was the aim to establish for the effect of a different B and W content at a $HL_1$-type layer with X=N. The following Table 13 lists the material of the interlayer as well as of the outer layer and the respective compositions of the target materials.

TABLE 13

| | Hard coating | | Target composition | |
| | | | Double layer | |
| No. | Inter-layer | Outer layer | Inter-layer | Outer layer |
| --- | --- | --- | --- | --- |
| 21$_{com.}$ | TiAlN | AlCrN | Ti0.5Al0.5 | Al0.7Cr0.3 |
| 22 | TiAlN | AlCrBWN | Ti0.5Al0.5 | Al0.7Cr0.226B0.067W0.007 |
| 23$_{com.}$ | TiAlN | AlCrWN | Ti0.5Al0.5 | Al0.7Cr0.28W0.02 |

Using such tools, a cutting test with the same parameters as in example 6 was applied The results are shown in Table 14

TABLE 14

| No. | Cutting length (m) | Amount of wear $v_{bmax}$ (mm) |
| --- | --- | --- |
| 21$_{com.}$ | 120 | 0.11 |
| 22 | 240 | 0.10 |
| 23$_{com.}$ | 150 | 0.11 |

EXAMPLE 8

In the eighth series of specimens which were coated with a two-layer coating system as addressed in Table 15, prior to the cutting tests a brushing treatment was applied using a brushing machine according to the DE GM 20 2006 000 654.1 in order to adjust a state comparable to an initial homogeneous wear, which ensures afterwards a homogeneous progress of the wear during the cutting application.

The treatment of the coated tool was conducted with rotary brushes according to the addressed document. FIG. 2 and the respective description on page 5, last para., until page 6, end of the first para. of this German Utilty Model No. 20 2006 000 654.1 is specifically included and referred to by reference in the present description with respect to the addressed brushing technique. The brush angle was about 30° with reference to the tool axis, rotation speed selected to 650 turns/minute. Brushing material was SiC impregnated Nylon, SiC grain size 400 mesh, diameter of bristles 0.45 mm, length of bristles 35 mm. Rotation of the tool satellite was 9 turns/min, rotation of the table supporting the satellites was about 0.3 turns/min. A similar effect to dissect a few micrometers' stripe of the workpiece material along the cutting edge could have been achieved by using $Al_2O_3$ impregnated brushes. Nevertheless, for this latter brushing, time has to be tripled if the same parameters as mentioned above are used. This may be realized e.g. by rotation of the supporting table by 0.1 turns/min.

Alternatively or even additionally a similar honing treatment by brush, blast, grinding operations or the like can be applied before the coating process as a pretreatment.

With the tool coated according to Table 15

TABLE 15

| | Hard coating | | Target composition Double layer | |
|---|---|---|---|---|
| No. | Inter-layer | Outer layer | Inter-layer | Outer layer |
| 24 | TiAlN | AlCrBWN | Ti0.5Al0.5 | Al0.7Cr0.226B0.067W0.007 | cutting tests were performed with the following cutting parameters:

| | |
|---|---|
| Cutting tool: | 2-fluted ball nose end mill, 5 mm ball radius, micro grain carbide grade material |
| Workpiece: | 1.2379 62 HRC |
| Spindle rotation speed: | 6000 rev/min |
| Axial depth of cut: | 0.4 mm |
| Radial depth of cut: | 0.05 mm |
| Feed rate: | 0.10 mm/tooth |
| Cutting speed: | 184 m/min |
| Feed: | 600 mm/min |
| Coolant: | air |
| Milling direction: | down milling technique for pockets (56 mm × 26 mm) |
| Length of single pass: | 1 pocket |
| End of toollife: | $v_{bmax} > 0.10$ mm at the end of a pocket |

TABLE 16

| No. | Brushing treatment (yes/no) | Number of pockets (N) |
|---|---|---|
| 24a | No | 4 |
| 24b | Yes | 10 |

From the examples as shown above it becomes clear that tools wherein the hard coating systems comprise the $HL_0$ layer in the specific form of $HL_1$ with X=N as in a single layer system or, and especially in connection with the addressed $IL_1$ and/or $IL_2$ interlayer, provide for an astonishing increase of wear resistance compared with state of the art coating systems e.g. with outermost TiAlN or AlCrN coating systems.

Despite the fact that the addressed $HL_1$ with X=N coating is applied through all the examples as the outermost layer of the coating system, it is evident to the skilled artisan that for some applications additional layers may be provided upon the addressed layer as e.g. a lubricating layer.

Further, throughout the examples the addressed $HL_1$ layer is, considered towards the tool body, applied either directly on the tool body or separate there from by a $IL_1$ or $IL_2$ interlayer.

Nevertheless, for some applications it is evident to the skilled artisan that such multilayer systems with the inventively proposed HL-type and IL-type layers may be conceived in a huge variety depending upon the specific needs.

Moreover, the above examples have been conducted specifically on the $HL_1$ layers, wherein X=N.

Nevertheless, it is perfectly clear to the skilled artisan that replacing N by C, CN, NO, CO or CNO will lead to layers $HL_1$ with similar wear resistance qualities.

The same is valid if in the $HL_1$ type layer the element W is replaced by Mo, Ta, Cb (Nb).

Still further, the tools whereupon the examples have been performed have a tool body of tungsten carbide.

Nevertheless, with respect to the material of the tool body or more generic workpiece body, it is perfectly clear to the skilled artisan that the targeted increase of wear resistance by the coating system according to the present invention will also be achieved on workpiece bodies of high speed steel, cemented carbide or cubic boron nitride or of a cermet or of a ceramic material. The addressed improvement of wear resistance may be highly desirable not only for tools like cutting tools such as for end mills, drills, cutting inserts, gear cutting tools but also for other workpieces than tools.

By the method of manufacturing a device which is at least in part of a hard material, thereby especially with a hardness of at least HRC 52, comprising a cutting process of the addressed hard material using the cutting tool according to the present invention, device manufacturing becomes faster, thus throughput higher and manufacturing costs are lowered.

Figure 6:
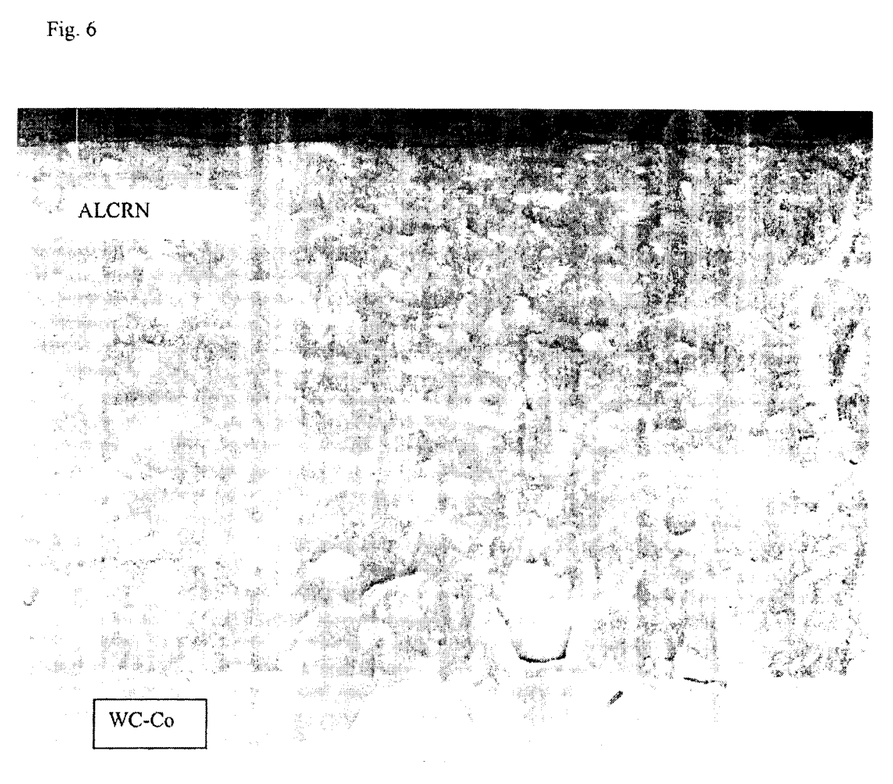
FIG. 6 a SEM of a cross-section of a AlCrN hard coating.

In FIG. 6 there is shown a SEM cross-section of a AlCrN coating. This accords with a scanning electron micrograph (SEM) of a cross-section of the single layer hard coating system according to specimen 3 of example No. 1. The hard coating exhibits a very fine columnar growth structure with columns having a width in the order of 200 nm.

Figure 7:
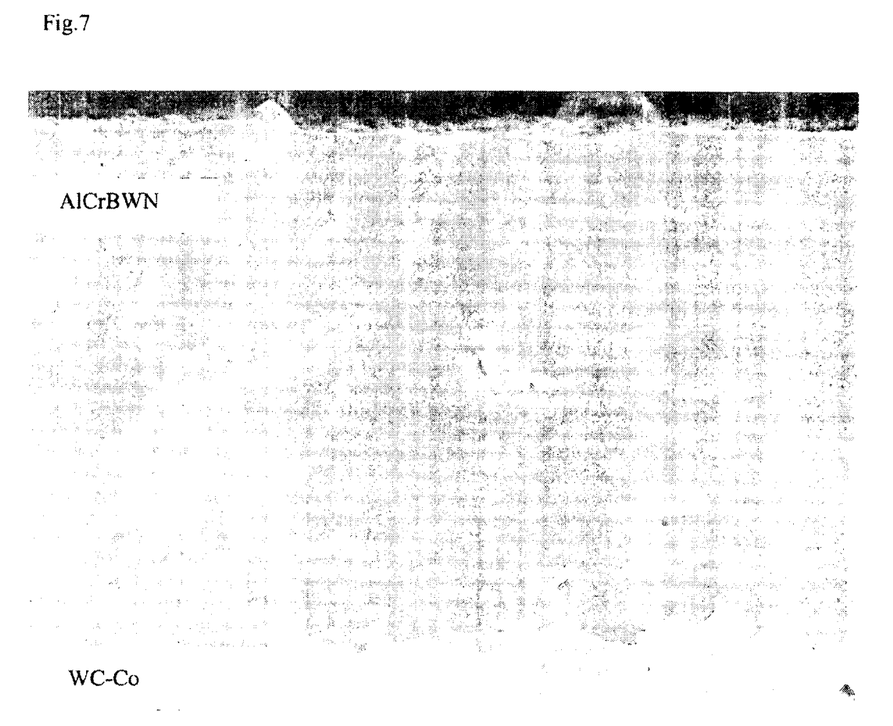
FIG. 7 a SEM of a cross-section of a AlCrBWN hard coating at a workpiece according to the invention.

FIG. 7 shows such scanning electron micrograph of a cross-section of the AlCrBWN single layer hard coating system according to specimen No. 4 of example 1. This hard coating exhibits no columnar growth structure. The strong re-nucleation process during deposition leads to a nanocrystalline coating structure which appears glassy like in the SEM cross-section under a magnification of 25'000.

Figure 8:
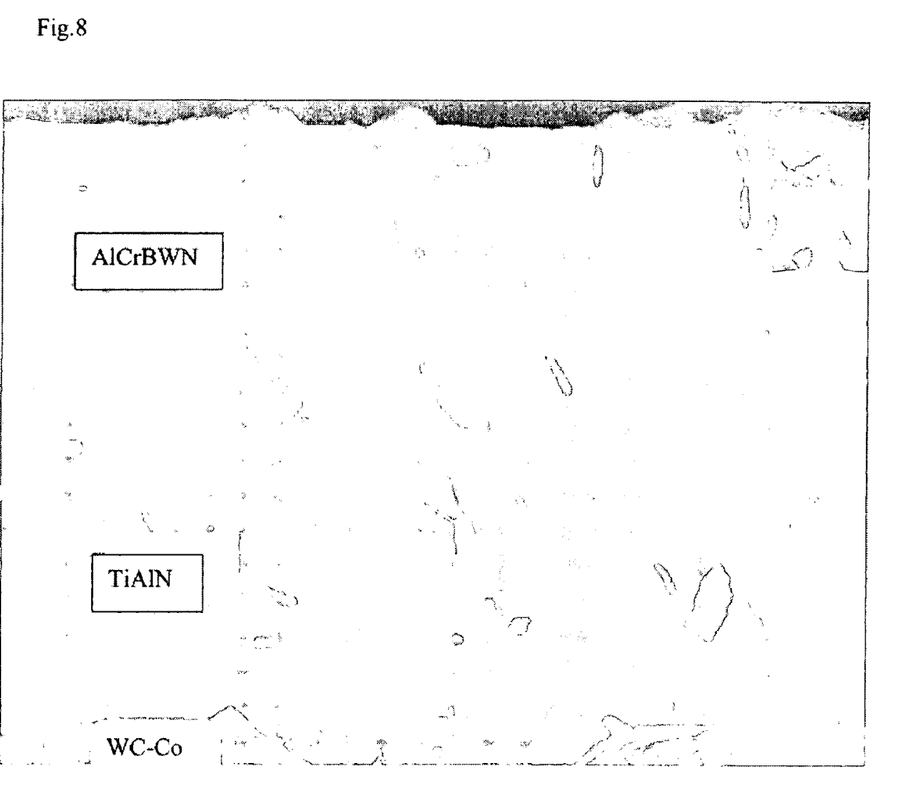
FIG. 8 a SEM of a cross-section of a TiAlN/AlCrBWN hard coating at a workpiece according to the invention.

FIG. 8 shows a scanning electron micrograph (SEM) of a cross section of a TiAlN/AlCrBWN double-layer hard coating system according to specimen 9 of Example 2. The $IL_1$ interlayer exhibits a columnar growth structure, with columns having a width in the order of 400 nm.

The type $HL_1$ outer layer exhibits the same glassy-like growth structure as specimen No. 4 of Example 1 (see FIG. 7). The columnar growth structure is clearly interrupted at the interface between the interlayer and the outer layer.

Figure 9:
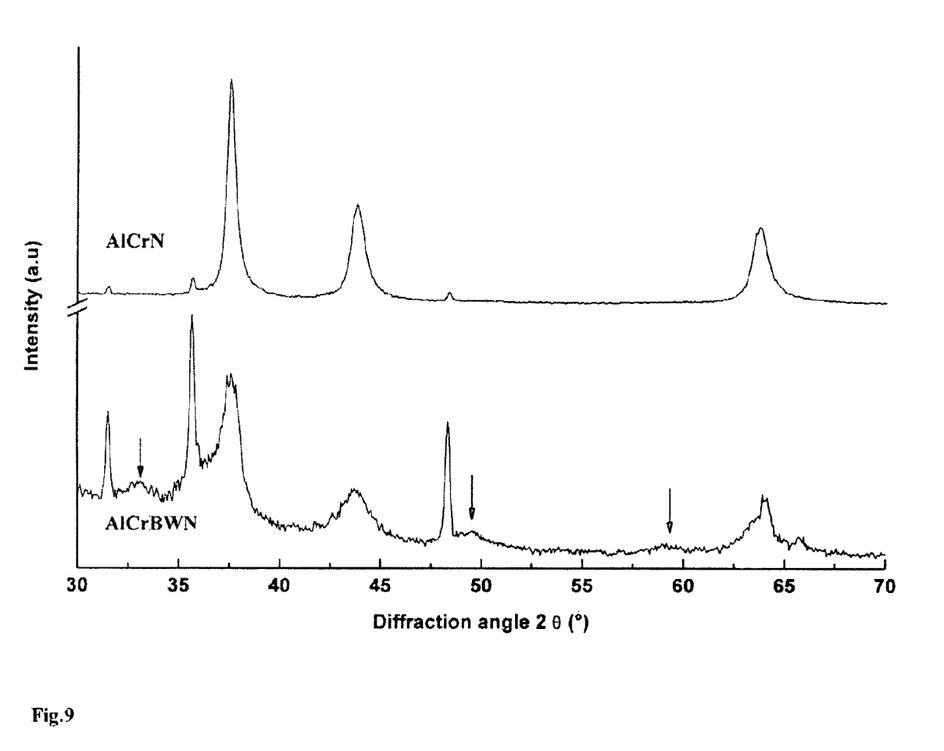
FIG. 9 XRD spectra of an AlCrN and of an AlCrBWN hard coating, latter at a workpiece according to the invention.

FIG. 9 shows XRD spectra of an AlCrN single-layer hard coating system according to specimen No. 3 of Example No. 1 and of an AlCrBWN type $HL_1$ single-layer hard coating system according to specimen number 4 of Example 1. The spectra were recorded with a Bruker AXS equipment, using a $Cu_{K\alpha}$, incident beam ($\lambda$=a 1.5406 nm) and a glancing incidence angle of 2° which delivers an appreciable quality for the spectra of nano-crystalline coatings. This configuration allows to measure even thin films without disturbing influence by the substrate and/or by an interlayer. The XRD spectrum of AlCrN exhibits peaks at around 37.5°, 43.7° and 63.7°, which are assigned to the <111>, <200> and <220> planes of an fcc-(face centered cubic)AlCrN crystal structure.

As expected for an $Al_xCr_{1-x}N$ hard coating having an x≦0.7, there is no hexagonal AlN phase in such hard coating. The AlCrBWN hard coating exhibits diffraction peaks which are assigned to the <111>, <200> and <220> planes of AlCrN as well. However $Al_xCrBWN$ hard coatings, having the same x of 0.7, show a remarkable contribution of hcp-(hexagonal closed packed) AlN. Peaks at around 33.1°, 49.5° and 58.9° point out signals attributed to that phase. Peaks at around 31.5°, 35.7°, 48.3°, 64.1° and 65.9° derive from the WC-Co body of the carbide substrate.

Figure 10:
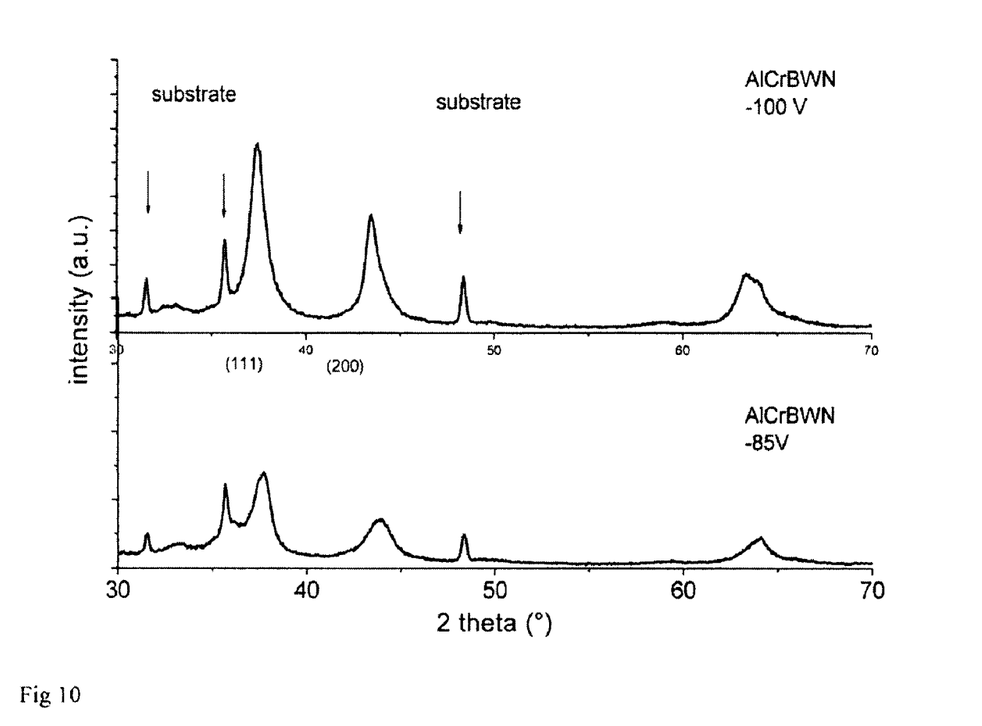
FIG. 10 XRD spectra of AlCrBWN hard coatings at workpieces according to the present invention.

FIG. 10 shows XRD spectra of AlCrBWN coatings comprising a TiAlN inter Measurement was performed using the setup as was described in context with FIG. 9. The upper spectrum refers to AlCrBWN coatings deposited under the deposition conditions of example 6 to 8. Lowering the substrate bias from −100 to −85 V against ground potential as shown in the lower spectrum of FIG. 10 gives a remarkable change with respect to the Q value, however obviously induces a peak broadening. The latter can be referred to a further grain refinement.

The invention claimed is:

1. A workpiece having a body and a wear resistant hard coating system on at least a part of the surface of said body, said system comprising at least one layer of the following composition $(Al_{1-a-b-c}Cr_aB_bZ_c)X$ where X is at least one of: N, C, CN, NO, CO, CNO;
Z is at least one of: W, Mo, Ta, Cb (Nb);
wherein there is valid $0.2 \leq a \leq 0.5$;

$0.01 \leq b \leq 0.2$;

$0.001 \leq c \leq 0.04$, wherein said at least one layer exhibits a glassy growth structure in the SEM cross-section.

2. The workpiece of claim 1, wherein said layer system comprises at least one layer of the following composition:

$(Al_{1-a-b-c}Cr_aB_bW_c)X$ wherein there is valid $0.01 \leq b \leq 0.1$;

$0.001 \leq c \leq 0.01$.

3. The workpiece of one of claim 1 or 2, wherein said at least one layer is the outermost layer of said system.

4. The workpiece of claim 1, wherein said at least one layer resides directly on said surface.

5. The workpiece of claim 1, wherein said system comprises at least one interlayer of $(Ti_dAl_e)N$.

6. The workpiece of claim 5, wherein said interlayer is interposed between said surface and said at least one layer.

7. The workpiece of claim 6, wherein said interlayer resides directly on at least one of said surface and of said at least one layer.

8. The workpiece of claim 7, wherein there is valid:

and

9. The workpiece of claim 1, wherein said system comprises at least one interlayer of $(Al_fCr_g)N$.

10. The workpiece of claim 9, wherein said interlayer is interposed between said surface and said at least one layer.

11. The workpiece of claim 10, wherein said interlayer resides directly on at least one of said surface and of said at least one layer.

12. The workpiece of claim 11, wherein there is valid $0.4 \leq f \leq 0.7$ and $0.3 \leq g \leq 0.6$.

13. The workpiece of claim 1, wherein said at least one layer has a texture coefficient Q=I(200)/I(111) in the range of $0.1 \leq Q \leq 1$.

14. The workpiece according to claim 5, wherein said $(Ti_dAl_e)N$ interlayer exhibits a columnar growth structure.

15. The workpiece of claim 1, wherein said system comprises a multilayer of alternating at least one layer of $(Al_{1-a-b}Cr_aB_bW_c)X$ and at least one coating subsystem, wherein said coating subsystem comprises at least one of a layer of $(Ti_dAl_e)N$ and a layer of $(Al_fCr_g)N$.

16. The workpiece of claim 1, said body being of one of high-speed steel, hardened steel, cemented carbide and of cubic boron nitride.

17. The workpiece of claim 1, said body being of one of a cermet and of a ceramic material.

18. The workpiece according to claim 9, wherein said $(Al_fCr_g)N$ interlayer exhibits a columnar growth structure.

* * * * *